United States Patent
Ashida

(10) Patent No.: US 8,421,653 B2
(45) Date of Patent: Apr. 16, 2013

(54) INFORMATION PROCESSING APPARATUS, INFORMATION PROCESSING METHOD, AND STORAGE MEDIUM

(75) Inventor: Jumpei Ashida, Artarmon (AU)

(73) Assignee: Canon Kabushiki Kaisha, Tokyo (JP)

( * ) Notice: Subject to any disclaimer, the term of this patent is extended or adjusted under 35 U.S.C. 154(b) by 190 days.

(21) Appl. No.: 13/007,230

(22) Filed: Jan. 14, 2011

(65) Prior Publication Data

US 2011/0193729 A1    Aug. 11, 2011

(30) Foreign Application Priority Data

Feb. 5, 2010    (JP) .................................. 2010-024824

(51) Int. Cl.
*H03M 7/40*    (2006.01)

(52) U.S. Cl.
USPC ................ 341/67; 341/65; 341/106; 341/107

(58) Field of Classification Search ..................... 341/65, 341/67, 106, 107
See application file for complete search history.

(56) References Cited

U.S. PATENT DOCUMENTS

| | | | |
|---|---|---|---|
| 5,625,355 A * | 4/1997 | Takeno et al. ................... | 341/67 |
| 5,914,680 A * | 6/1999 | Murashita ..................... | 341/107 |
| 5,929,793 A * | 7/1999 | Choi ............................... | 341/67 |
| 5,933,536 A * | 8/1999 | Fukuzawa ...................... | 382/246 |
| 5,969,650 A * | 10/1999 | Wilson ............................ | 341/67 |
| 5,991,451 A * | 11/1999 | Keith et al. .................... | 382/246 |
| 6,696,992 B1 * | 2/2004 | Chu ................................ | 341/67 |
| 7,095,343 B2 * | 8/2006 | Xie et al. ....................... | 341/107 |
| 7,420,993 B2 * | 9/2008 | Tasaki ............................ | 370/535 |
| 2004/0207546 A1 * | 10/2004 | Webb ............................. | 341/67 |
| 2005/0261893 A1 * | 11/2005 | Toyama et al. ................ | 704/201 |
| 2008/0224905 A1 * | 9/2008 | Reznik ........................... | 341/67 |
| 2008/0285864 A1 | 11/2008 | Ishikawa ....................... | 382/232 |

FOREIGN PATENT DOCUMENTS

| | | |
|---|---|---|
| JP | 2001-094985 A | 4/2001 |
| JP | 2002-094801 A | 3/2002 |
| JP | 2008-278042 A | 11/2008 |

* cited by examiner

*Primary Examiner* — Linh Nguyen

(74) *Attorney, Agent, or Firm* — Fitzpatrick, Cella, Harper & Scinto

(57) ABSTRACT

An information processing apparatus for converting fixed-length codes into variable-length codes comprises: an input unit configured to obtain each of the fixed-length codes as an input code; a determination unit configured to determine a fixed length encoding method of the input code; a conversion unit configured to perform variable length encoding, by using a first variable length encoding method, on the input code encoded by a first fixed length encoding method, and perform variable length encoding, by using a second variable length encoding method, on the input code encoded by a second fixed length encoding method; and an output unit configured to output a variable-length code obtained by the conversion unit.

9 Claims, 14 Drawing Sheets

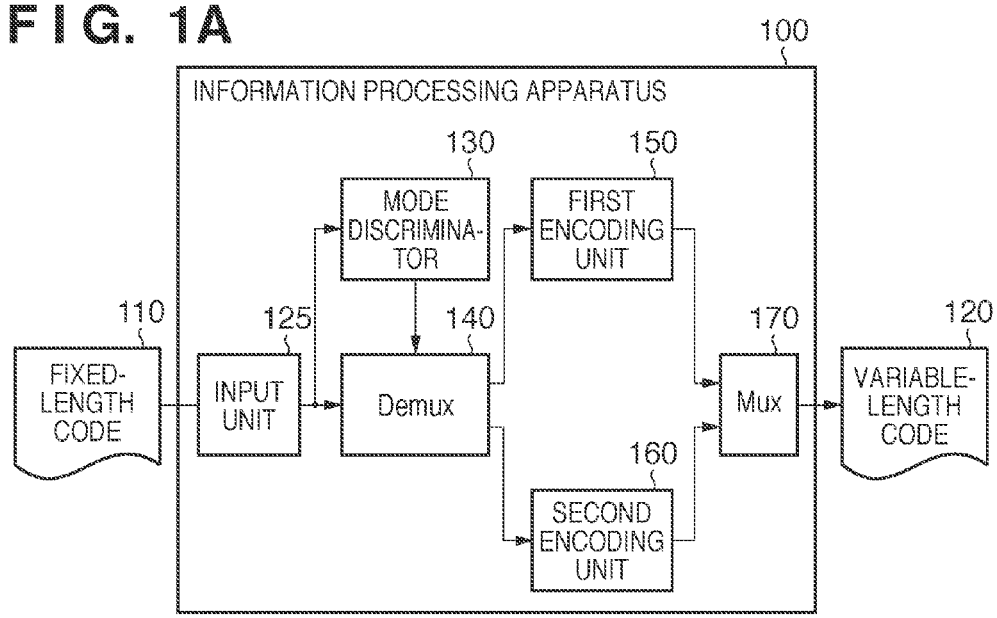
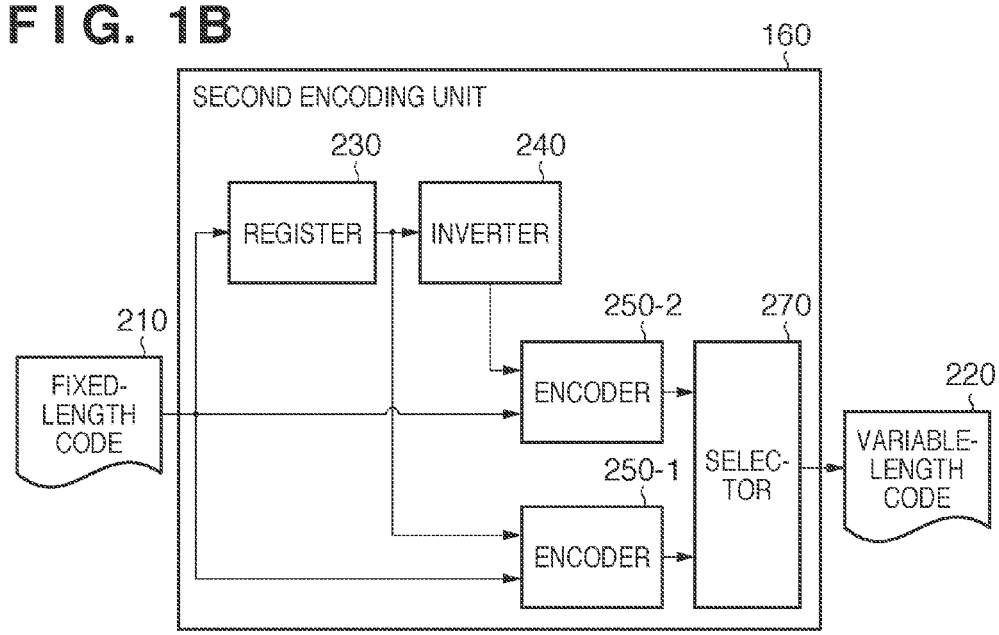

FIG. 2A

| 80 | 79   72 | 71   64 | 63                     0 |
|----|---------|---------|--------------------------|
| 1  | C0      | C1      | POSITION INFORMATION     | mode

FIG. 2B

| 80 | 79   72 | 71            | | 0 |
|----|---------|---------------|-|---|
| 0  | DC      | AC    | EOB | 00.....0 | mode

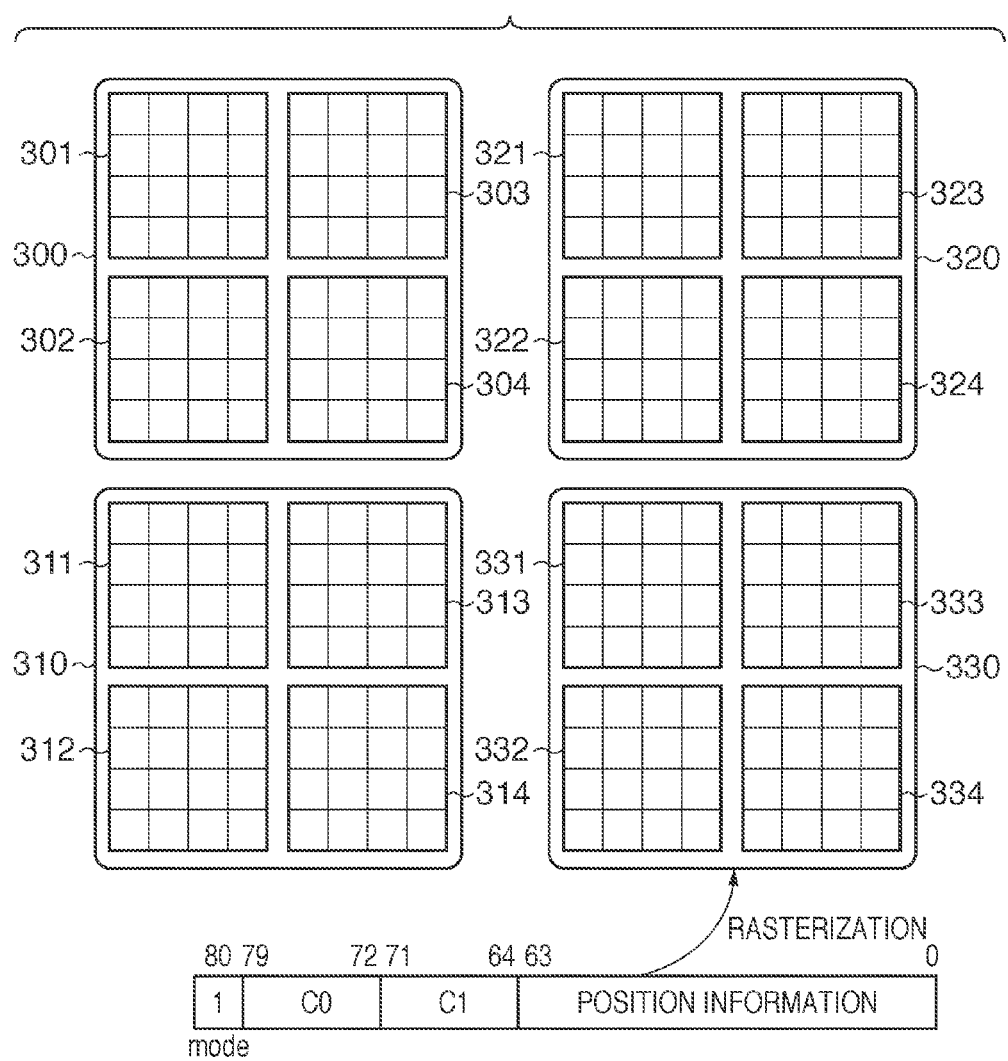

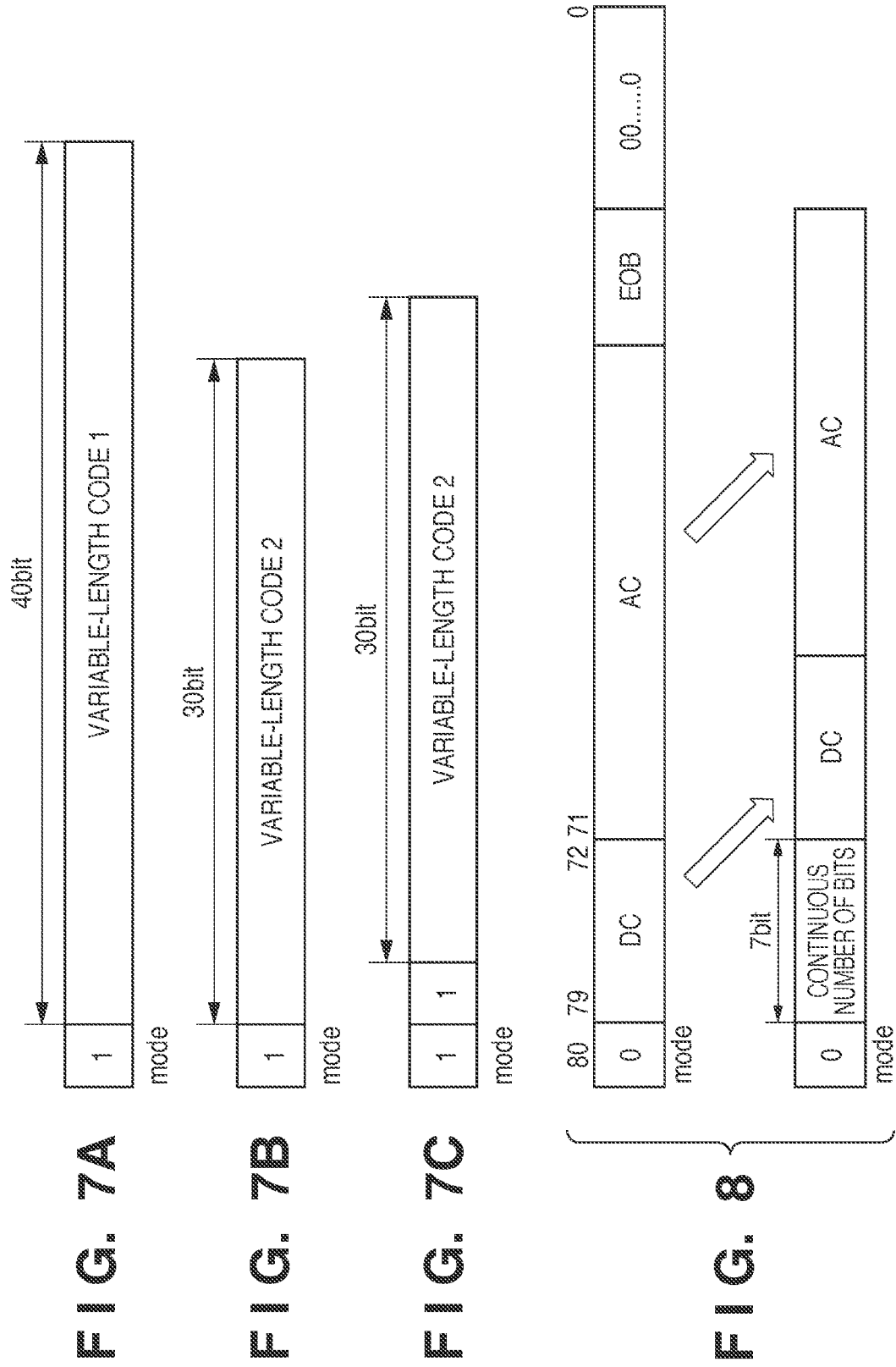

FIG. 13

| FIXED LENGTH ENCODING MODE | THREE UPPER BITS OF FIXED-LENGTH CODE | SELECTED ENCODER |
|---|---|---|
| BI-LEVEL MODE | 000 | 011 |
| | 001 | |
| | 010 | |
| | 011 | |
| CONTINUOUS TONE MODE | 100 | 100 |
| | 101 | |
| MODE A | 110 | 110 |
| MODE B | 111 | 111 |

F I G. 14A

| SLOT NUMBER | STATE | ENCODER 1 | ENCODER 2 | ENCODER 3 | MINIMUM NUMBER OF BITS | MINIMUM BIT ENCODER |
|---|---|---|---|---|---|---|
| 1 | EFFECTIVE | PROCESSED | BEING PROCESSED | PROCESSED | 60 | 3 |
| 2 | EFFECTIVE | PROCESSED | UNPROCESSED | BEING PROCESSED | 81 | 1 |
| 3 | EFFECTIVE | BEING PROCESSED | UNPROCESSED | UNPROCESSED | - | - |
| 4 | EMPTY | UNPROCESSED | UNPROCESSED | UNPROCESSED | - | - |

F I G. 14B

| SLOT NUMBER | STATE | ENCODER 1 | ENCODER 2 | ENCODER 3 | MINIMUM NUMBER OF BITS | MINIMUM BIT ENCODER |
|---|---|---|---|---|---|---|
| 1 | EFFECTIVE | PROCESSED | BEING PROCESSED | PROCESSED | 60 | 3 |
| 2 | EFFECTIVE | PROCESSED | UNPROCESSED | BEING PROCESSED | 81 | 1 |
| 3 | EFFECTIVE | BEING PROCESSED | UNPROCESSED | UNPROCESSED | - | - |
| 4 | EFFECTIVE | UNPROCESSED | UNPROCESSED | UNPROCESSED | - | - |

FIG. 14C

| SLOT NUMBER | STATE | ENCODER 1 | ENCODER 2 | ENCODER 3 | MINIMUM NUMBER OF BITS | MINIMUM BIT ENCODER |
|---|---|---|---|---|---|---|
| 1 | EFFECTIVE | PROCESSED | PROCESSED | PROCESSED | - | - |
| 2 | EFFECTIVE | PROCESSED | BEING PROCESSED | PROCESSED | 40 | 2 |
| 3 | EFFECTIVE | BEING PROCESSED | UNPROCESSED | BEING PROCESSED | 50 | 3 |
| 4 | EFFECTIVE | UNPROCESSED | UNPROCESSED | UNPROCESSED | - | - |

FIG. 14D

| SLOT NUMBER | STATE | ENCODER 1 | ENCODER 2 | ENCODER 3 | MINIMUM NUMBER OF BITS | MINIMUM BIT ENCODER |
|---|---|---|---|---|---|---|
| 4 | EMPTY | UNPROCESSED | UNPROCESSED | UNPROCESSED | - | - |
| 1 | EFFECTIVE | PROCESSED | BEING PROCESSED | PROCESSED | - | - |
| 2 | EFFECTIVE | BEING PROCESSED | UNPROCESSED | PROCESSED | 50 | 3 |
| 3 | EFFECTIVE | UNPROCESSED | UNPROCESSED | BEING PROCESSED | 81 | 3 |

F I G. 15
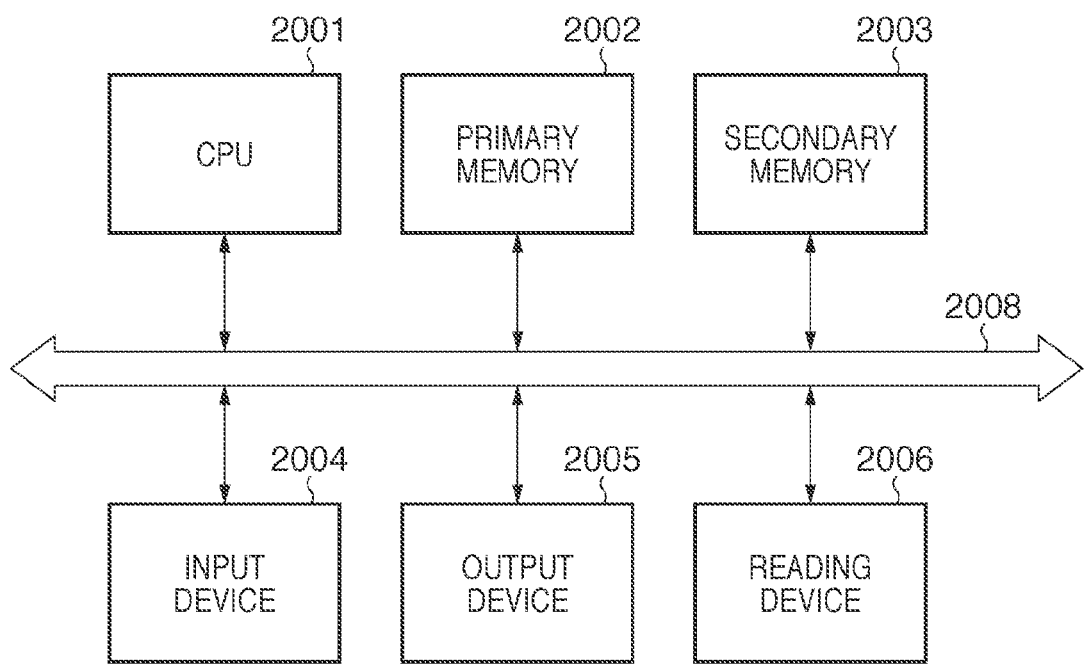

INFORMATION PROCESSING APPARATUS, INFORMATION PROCESSING METHOD, AND STORAGE MEDIUM

BACKGROUND OF THE INVENTION

1. Field of the Invention

The present invention relates to an image data encoding technique.

2. Description of the Related Art

A fixed-length-encoded image is very convenient for image editing such as rotation. However, a fixed-length-encoded image generally has a data size larger than that of a variable-length-encoded image. When storing an image in a hard disk or the like, therefore, it is disadvantageous to perform fixed length encoding on the image from the viewpoint of the volume. Accordingly, a method of further performing variable length encoding on a fixed-length-encoded image has been developed.

For example, Japanese Patent Laid-Open No. 2002-094801 discloses a method which, if the same fixed-length-encoded data continues, performs variable length encoding by encoding the number of times of repetition of the fixed-length-encoded data. Also, Japanese Patent Laid-Open No. 2001-094985 discloses a method of allocating a predetermined number of bits to each frequency component of an image, and further performing entropy encoding.

Unfortunately, an image is sometimes encoded by using two or more fixed length encoding methods. For example, Japanese Patent Laid-Open No. 2008-278042 discloses a method of dividing an image into a plurality of regions, and performing fixed length encoding on each region by using a selected fixed length encoding method. In encoded image data made up of two or more kinds of fixed length codes as described above, the possibility that the same fixed-length-encoded data continues is low. Accordingly, the effect of compression is presumably low even when using the method of Japanese Patent Laid-Open No. 2002-094801. Also, different kinds of fixed length codes have different bit assignments. When using the method of Japanese Patent Laid-Open No. 2001-094985, therefore, not only the extraction of each component is complicated, but also the statistical properties are different. This may make it impossible to increase the compression rate.

SUMMARY OF THE INVENTION

The present invention makes it possible to efficiently perform variable length encoding on encoded image data made up of two or more kinds of fixed length codes.

According to one aspect of the invention, an information processing apparatus for converting fixed-length codes into variable-length codes, each of the fixed-length codes being generated by performing fixed length encoding, by using one of a plurality of fixed length encoding methods, on each divided image obtained by dividing an original image, comprises: an input unit configured to obtain each of the fixed-length codes as an input code; a determination unit configured to determine a fixed length encoding method of the input code; a conversion unit configured to perform variable length encoding, by using a first variable length encoding method, on the input code encoded by a first fixed length encoding method, and perform variable length encoding, by using a second variable length encoding method, on the input code encoded by a second fixed length encoding method; and an output unit configured to output a variable-length code obtained by the conversion unit.

According to another aspect of the invention, an information processing apparatus for converting fixed-length codes into variable-length codes, each of the fixed-length codes being generated by performing fixed length encoding, by using one of a plurality of fixed length encoding methods, on each divided image obtained by dividing an original image, comprises: an input unit configured to obtain the fixed-length code as an input code; a determination unit configured to determine a fixed length encoding method of the input code; a conversion unit comprising a plurality of converters each configured to convert the input fixed-length code into a variable-length code based on the fixed length encoding method determined by the determination unit, and output the variable-length code as an output code, or directly output the input fixed-length code as an output code; and a selection unit configured to input the input code obtained by the input unit to each converter of the conversion unit, and thereafter selectively output an output code having a smallest code amount among the output codes output from the converters, wherein the converters are individually set to convert fixed-length codes encoded by different fixed length encoding methods into variable-length codes, and each converter converts the input fixed-length code into a variable-length code and outputs the variable-length code as an output code if a fixed length encoding method of the input fixed-length code is the set fixed length encoding method, and directly outputs the input fixed-length code as an output code if a fixed length encoding method of the input fixed-length code is not the set fixed length encoding method.

According to still another aspect of the invention, an information processing method for converting fixed-length codes into variable-length codes, each of the fixed-length codes being generated by performing fixed length encoding, by using one of a plurality of fixed length encoding methods, on each divided image obtained by dividing an original image, comprises the steps of: obtaining each of the fixed-length codes as an input code; determining a fixed length encoding method of the input code; performing variable length encoding, by using a first variable length encoding method, on the input code encoded by a first fixed length encoding method, and performing variable length encoding, by using a second variable length encoding method, on the input code encoded by a second fixed length encoding method; and outputting a variable-length code obtained in the performing step.

According to yet another aspect of the invention, an information processing method for converting fixed-length codes into variable-length codes, each of the fixed-length codes being generated by performing fixed length encoding, by using one of a plurality of fixed length encoding methods, on each divided image obtained by dividing an original image, comprises: a step of obtaining the fixed-length code as an input code; a step of determining a fixed length encoding method of the input code; a plurality of converting steps of converting the input fixed-length code into a variable-length code based on the fixed length encoding method determined in the determining step and outputting the variable-length code as an output code, or directly outputting the input fixed-length code as an output code; and a step of selectively outputting an output code having a smallest code amount among the output codes, wherein each converting step is individually predetermined for converting fixed-length codes encoded by different fixed length encoding methods into variable-length codes, and in each converting step the input fixed-length code is converted into a variable-length code and output as an output code if a fixed length encoding method of the input fixed-length code is the predetermined fixed length encoding method, and the input fixed-length code is directly output as an output code if a fixed length encoding method of the input fixed-length code is not the predetermined fixed length encoding method.

According to the present invention, variable length encoding can efficiently be performed on encoded image data made up of two or more kinds of fixed length codes.

Further features of the present invention will become apparent from the following description of exemplary embodiments (with reference to the attached drawings).

BRIEF DESCRIPTION OF THE DRAWINGS

FIGS. 1A and 1B are block diagrams showing an example of the arrangement of an information processing apparatus according to the first embodiment;

FIGS. 2A and 2B are views showing examples of bit assignments of fixed length codes according to the first embodiment;

FIGS. 5A and 5B are views for explaining an example of processing performed by an inverter 240 according to the first embodiment;

FIG. 6 is a view for explaining an example of variable length encoding of position information according to the first embodiment;

FIGS. 7A to 7C are views for explaining an example of processing performed by a selector 270 according to the first embodiment;

FIG. 8 is a view for explaining an example of variable length encoding in a continuous tone mode according to the first embodiment;

FIG. 13 is a view showing an example of a mode table 930 according to the third embodiment;

FIGS. 14A to 14D are views showing examples of slot boards according to the third embodiment; and FIG. 15 is a block diagram showing an example of the arrangement of a computer according to the fourth embodiment.

DESCRIPTION OF THE EMBODIMENTS

Figure 3:
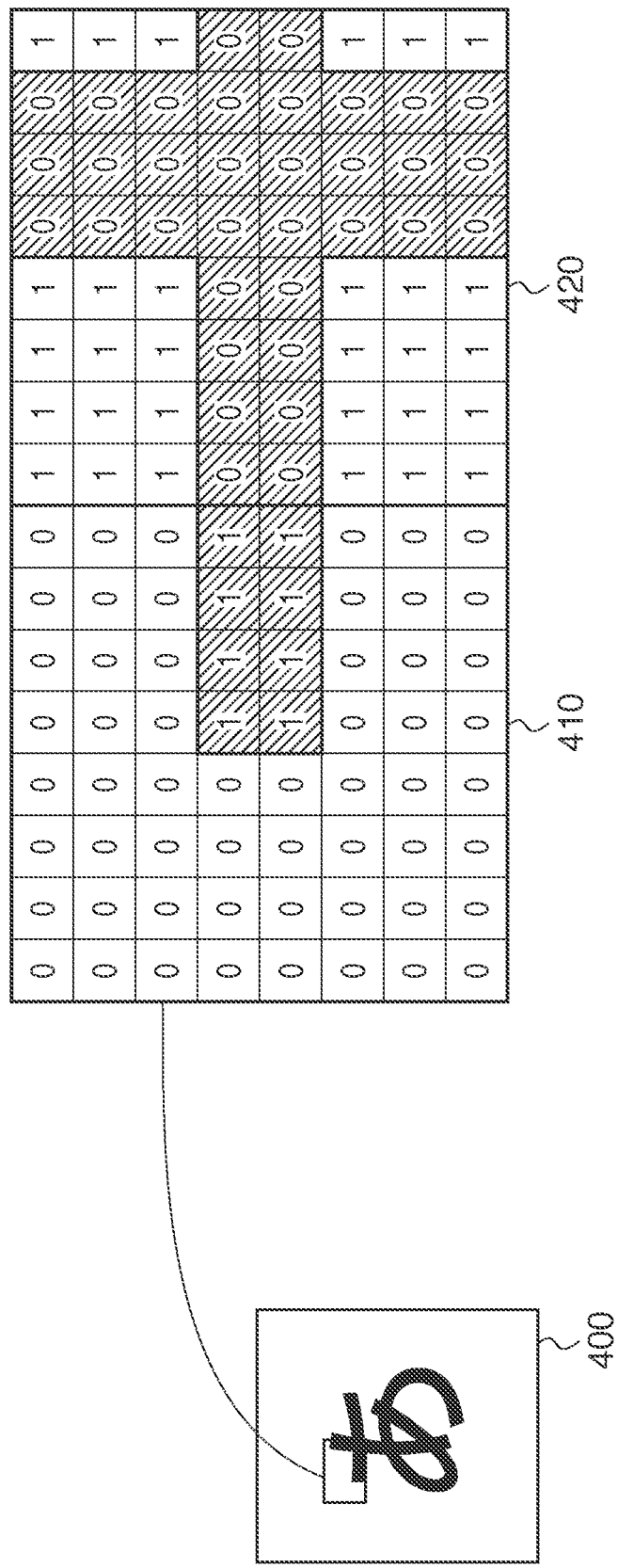
FIG. 3 is a view for explaining an example of variable length encoding in a bi-level mode according to the first embodiment.

Embodiments of the present invention will be explained below with reference to the accompanying drawings. However, the scope of the present invention is not limited to the following embodiments.

First Embodiment

This embodiment performs variable length encoding on a fixed-length code. A fixed-length code as an input is generated by encoding a portion (block image (divided image)) of a processing target image (original image) such that the encoded image has a predetermined number of bits. A fixed-length code is generated by one of a plurality of fixed length encoding methods (fixed length encoding modes). The fixed length encoding modes of this embodiment are two modes, that is, a continuous tone mode and bi-level mode (each mode will be described in detail later). Each block image is fixed-length-encoded by one of these encoding modes. Fixed length encoding may be performed by an appropriate encoding mode selected for each block image. Since the characteristic of a fixed-length code changes in accordance with a fixed length encoding mode used, an optimum variable length encoding method changes in accordance with the fixed length encoding mode. In the present invention, therefore, the encoding mode of a fixed-length code is discriminated. A high compression rate is achieved by using a variable length encoding method selected from a plurality of variable length encoding methods in accordance with the discriminated encoding mode.

FIG. 1A shows an example of an information processing apparatus 100 according to this embodiment. In this embodiment, a fixed-length code 110 is input to the information processing apparatus 100. The information processing apparatus 100 performs variable length encoding on the fixed-length code 110, and outputs a variable-length code 120. The fixed-length code 110 will be explained below. The fixed-length code 110 is obtained by dividing a processing target image into 8×8-pixel block images, and encoding each block image into an 81-bit fixed-length code. In this embodiment, this fixed-length code is input to the information processing apparatus 100 in the raster sequence of the processing target image.

FIGS. 2A and 2B illustrate examples of the structure of the fixed-length code, that is, bit assignments. MSB (Most Significant Bit) indicates a fixed length encoding mode. The MSB will be called mode information hereinafter. When the mode information is "1", the fixed-length code is encoded by the bi-level mode. When the mode information is "0", the fixed-length code is encoded by the continuous tone mode. It is of course also possible to indicate the encoding mode of the fixed-length code by another method.

Each fixed length encoding mode will now be explained. FIG. 2A shows an example of bit assignment in the bi-level mode. Referring to FIG. 2A, C0 (a first pixel value) and C1 (a second pixel value) each are 8-bit information indicating a pixel value. Fixed length encoding approximates a pixel value in a block image to C0 or C1. Position information (identification information) is 64-bit information. The position information indicates whether each pixel in a block image corresponds to the pixel value C0 or C1, by using one bit for each pixel. When forming the histogram of pixel values in a block image, a pixel value having the highest appearance frequency can be C0, and a pixel value having the second highest appearance frequency can be C1.

FIG. 2B shows an example of bit assignment in the continuous tone mode. In the continuous tone mode, an 8×8-pixel block image is reduced into a 4×4-pixel image. 4×4 DCT coefficients are obtained by performing discrete cosign transform on the 4×4-pixel image. The 8-bit DC components (DC coefficients) are stored in the fixed-length code. AC components are transformed in accordance with a Huffman table in the order of, for example, zigzag scan, and the transformed values (AC coefficients) are sequentially stored in the fixed-length code. The AC components may be stored in descending order of frequency from the end of the fixed-length code. If the fixed length (81 bits) is exceeded midway along the storage of the AC components, the storage of the AC components is aborted. Also, if all unstored DCT coefficients are 0s, an EOB code is stored. The EOB code can be, for example, "0000". The number of encoded bits can be set to the fixed length (81 bits) by storing, for example, "0" after the EOB code.

Each unit of the information processing apparatus 100 of this embodiment will briefly be explained below. An input unit 125 sequentially acquires fixed-length codes 110. A mode discriminator 130 discriminates the encoding mode of each fixed-length code 110. A demultiplexer 140 sends the fixed-length code 110 to a first encoding unit 150 or second encoding unit 160. The first encoding unit 150 converts a fixed-length code encoded by the continuous tone mode into a variable-length code. The second encoding unit 160 converts a fixed-length code encoded by the bi-level mode into a variable-length code. A multiplexer 170 acquires the variable-length code from the first encoding unit 150 or second encoding unit 160, and outputs the code as a variable-length code 120.

Figure 4:
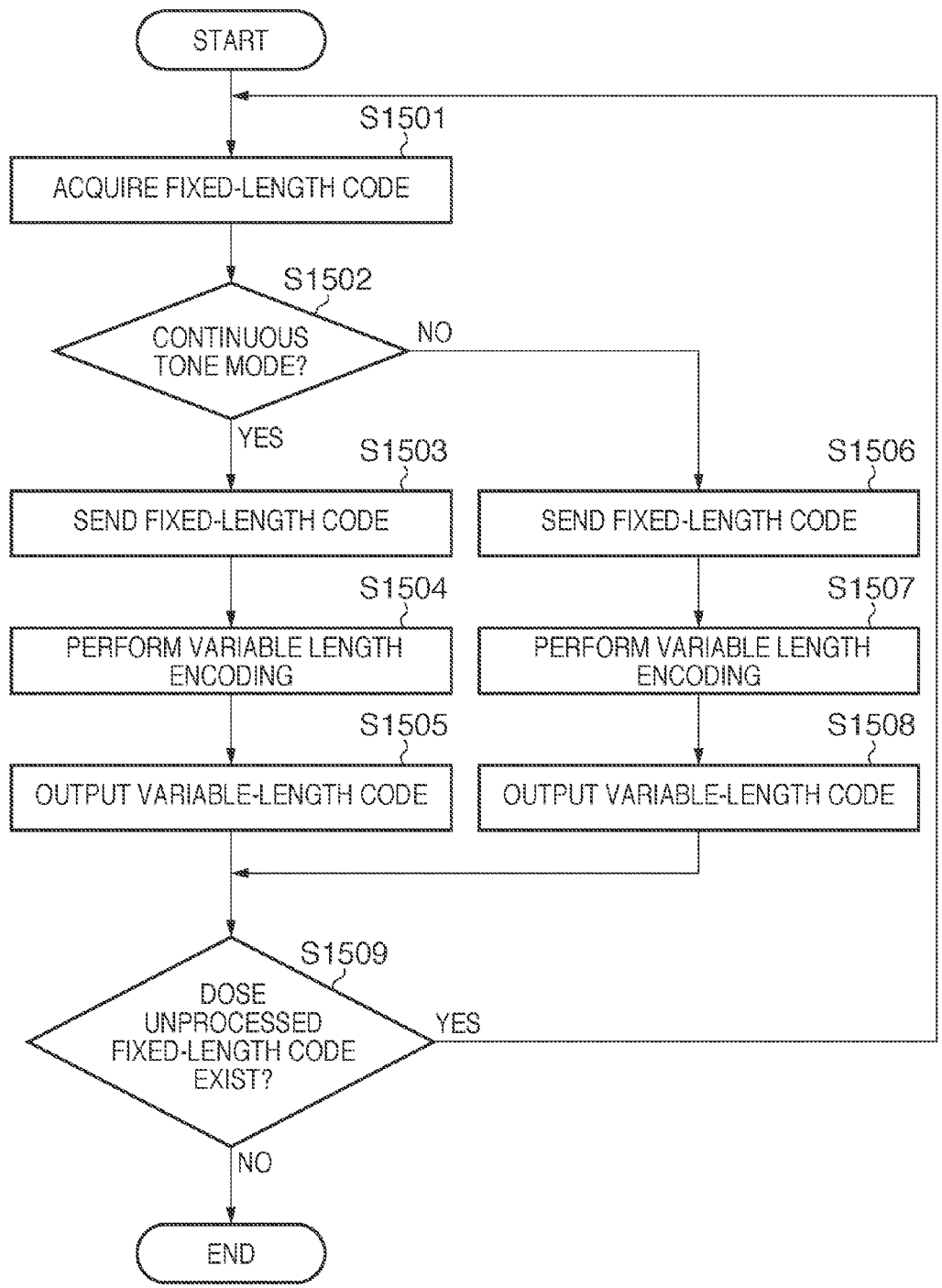
FIG. 4 is a flowchart showing an example of the processing of the information processing apparatus according to the first embodiment.

The processing performed by the information processing apparatus 100 of this embodiment will be explained below with reference to a flowchart shown in FIG. 4. In step S1501, the input unit 125 (an input unit) acquires the fixed-length code 110 (an input code). In step S1502, the mode discriminator 130 (a determination unit) discriminates the encoding mode of the fixed-length code 110. In this embodiment, if the MSB of the fixed-length code 110 is 0, the mode discriminator 130 determines that the fixed-length code 110 is encoded by the continuous tone mode. In this case, the process advances to step S1503. If the MSB of the fixed-length code 110 is 1, the mode discriminator 130 determines that the fixed-length code 110 is encoded by the bi-level mode. In this case, the process advances to step S1506.

In step S1503, the multiplexer 140 sends the fixed-length code 110 to the first encoding unit 150. In step S1504, the first encoding unit 150 (a conversion unit) converts the fixed-length code 110 encoded by the continuous tone mode into the variable-length code 120. The processing in step S1504 will be explained later. In step S1505, the multiplexer 170 (an output unit) outputs the variable-length code 120 generated by the first encoding unit 150.

On the other hand, in step S1506, the demultiplexer 140 sends the fixed-length code 110 to the second encoding unit 160. In step S1507, the second encoding unit 160 (a conversion unit) converts the fixed-length code 110 encoded by the bi-level mode into the variable-length code 120. The processing in step S1507 will be explained later. In step S1508, the multiplexer 170 outputs the variable-length code 120 generated by the second encoding unit 160.

In step S1509, the input unit 125 determines whether there is an unprocessed fixed-length code. If there is an unprocessed fixed-length code, the process returns to step S1501. If there is no unprocessed fixed-length code, the process of this embodiment is terminated.

<Variable Length Encoding of Fixed-Length Code Encoded by Continuous Tone mode>

Various methods can be used as the method of performing variable length encoding on the fixed-length code encoded by the continuous tone mode (a first fixed length encoding method) in step S1504. One example will be explained below. A fixed-length code encoded by the continuous tone mode often has continuous "0"s in lower bits. As shown in FIG. 8, therefore, the first encoding unit 150 stores the number of continuous "0"s in lower bits in a converted fixed-length code (a first variable length encoding method).

For example, the first encoding unit 150 counts continuous "0"s in order from the LSB (the end) of the fixed-length code 110. Then, the first encoding unit 150 inserts the count (run-length) as 7-bit data immediately after the mode information. After that, the first encoding unit 150 deletes the counted continuous "0"s.

When the 8×8-pixel block image is monotone, for example, no AC component exists. In this method, therefore, one block image is compressed into 8 to 16 bits. When an image to be encoded is, for example, a document including many monotone blocks, a high compression rate can be achieved by variable length encoding. In this embodiment, continuous "0"s at the end are replaced with a value indicating the number of "0"s. However, the first variable length encoding method is not limited to this. For example, it is also possible to detect the continuation of predetermined values in the fixed-length code 110 (an input code), and replace the continuation of the predetermined values by a value indicating the length of the continuation of the predetermined values.

<Variable Length Encoding of Fixed-Length Code Encoded by Bi-Level Mode>

Various methods can be used as the method of performing variable length encoding on the fixed-length code encoded by the bi-level mode (a second fixed length encoding method) in step S1507. For example, it is possible to obtain the difference between adjacent block images in an image before fixed length encoding, and generate a variable-length code from this difference (a second variable length encoding method). When using the bi-level mode as a fixed length encoding method, C0 and C1 described above are often inverted between adjacent block images. This particularly applies to an image in which, for example, the background and characters are expressed in different colors.

In FIG. 3, for example, reference numeral 400 denotes an original image including black and white pixels; and 410 and 420, block images in the original image 400. The block images 410 and 420 are 8×8-pixel block images. In this embodiment, the block image 410 contains many white pixels, so the white pixels are assigned C0, and black pixels are assigned C1. On the other hand, the block image 420 contains many black pixels, so the black pixels are assigned C0, and white pixels are assigned C1. That is, C0 and C1 are inverted between the block images 410 and 420.

In a case like this, the compression rate may not be increased even when encoding the difference between the block images 410 and 420. Accordingly, the second encoding unit of this embodiment obtains the difference after inverting C0 and C1 in one block image. Then, the second encoding unit compares a code amount obtained without inversion with that obtained by using inversion, and adopts a smaller code amount.

FIG. 1B shows an example of the arrangement of the second encoding unit 160 according to this embodiment. Bi-level-mode, fixed-length codes 210 are sequentially input to the second encoding unit 160. As described previously, the fixed-length codes 210 are input in the raster sequence of a processing target image. An encoder 250-1 acquires the input fixed-length code 210. In addition, the encoder 250-1 acquires the fixed-length code of a block image near a block image indicated by the acquired fixed-length code 210, from a register 230. In the following description, it is assumed that the encoder 250-1 acquires the fixed-length code of a block image adjacent to a block image indicated by the acquired fixed-length code 210, from the register 230. FIG. 6 shows the layout of block images 300, 310, 320, and 330 in a processing target image. When the fixed-length code 210 corresponds to the block image 330, the encoder 250-1 acquires, for example, fixed-length codes corresponding to the block images 310 and 320. The register 230 is a storage unit for storing fixed-length codes input to the second encoding unit 160.

An encoder 250-2 similarly acquires the input fixed-length code 210. In addition, the encoder 250-2 acquires the fixed-length code of a block image adjacent to a block image indicated by the acquired fixed-length code 210. However, the fixed-length code of the block image adjacent to the block image indicated by the fixed-length code 210, which is obtained by the encoder 250-2, is a code inverted by an inverter 240. FIGS. 5A and 5B illustrate the inversion processing performed by the inverter 240. The inverter 240 acquires the fixed-length code of the block image adjacent to the block image indicated by the acquired fixed-length code 210, and switches C0 and C1, thereby inverting each bit indicating position information (converting 0 into 1, and 1 into 0). For example, the inverter 240 converts a fixed-length code shown in FIG. 5A into a fixed-length code shown in FIG. 5B. The inverter 240 then supplies the converted fixed-length code to the encoder 250-2.

The encoder 250-1 performs variable length encoding on the fixed-length code 210 by using the correlation with the fixed-length code acquired from the register 230. Also, the encoder 250-2 performs variable length encoding on the fixed-length code 210 by using the correlation with the fixed-length code acquired from the inverter 240. For example, variable length encoding can be performed by predictive encoding such as DPCM (Differential Pulse Code Modulation).

An example of the variable length encoding is as follows. C0 and C1 are checked by referring to the fixed-length code of a block image adjacent to the left side of the block image indicated by the fixed-length code 210. The fixed-length code 210 is predictively encoded by using the referred fixed-length code. For example, the difference between C0 of the fixed-length code 210 and C0 of the fixed-length code of the adjacent block image is stored in a variable-length code corresponding to the fixed-length code 210. C1 is processed in the same manner as above. If there is no block image adjacent to the left side of the block image indicated by the fixed-length code 210, C0 and C1 of the fixed-length code 210 are directly stored in the variable-length code corresponding to the fixed-length code 210.

The same applies when the block image adjacent to the left side of the block image indicated by the fixed-length code 210 is not fixed-length-encoded by the bi-level mode. In this case, flag information indicating whether C0 and C1 are directly stored in the variable-length code or the difference between C0 and C1 is stored in the variable-length code can be added to the variable-length code. Generally, adjacent block images are often similar, so the difference between C0 and C1 is in many cases 0 or a small value. Accordingly, the entropy after variable length encoding can be small.

An example of the variable length encoding of position information will be explained in detail below with reference to FIG. 6. Referring to FIG. 6, the block images 300, 310, 320, and 330 are portions of a processing target image. The block images 300 and 320 are adjacent to each other. The block images 300 and 310 are adjacent to each other. The block images 310 and 330 are adjacent to each other. The block images 320 and 330 are adjacent to each other. Assume that the fixed-length code 210 corresponds to the block image 330.

The block image 330 has a high correlation to the adjacent block images 310 and 320, and hence can be compressed by predictive encoding by, for example, the following method. First, the position information of the block image 320 adjacent to the block image 330 from above is compared with that of the block image 330. If the two pieces of position information match, "00" is stored as position information in a variable-length code corresponding to the fixed-length code 210. Then, the position information of the block image 310 adjacent to left side of the block image 330 is compared with that of the block image 330. If the two pieces of position information match, "01" is stored as position information in the variable-length code corresponding to the fixed-length code 210.

If the adjacent block image 310 or 320 does not exist or is not encoded by the bi-level mode, it is determined that the two pieces of position information do not match. If the position information of the block image 330 does not match that of either the block image 310 or 320, data obtained by adding "1" to the head of the position information of the fixed-length code 210 is stored as position information in the variable-length code corresponding to the fixed-length code 210. When a processing target image is, for example, a character or table containing many vertical and horizontal straight lines, the method of this embodiment can achieve a high compression rate.

In this embodiment, the variable-length codes generated by the encoders 250-1 and 250-2 contain at least a code indicating C0, a code indicating C1, and a code indicating the position information. To identify information indicated by each code, the code may have a bit string indicating the type of code at, for example, the head of the code.

A selector 270 compares the variable-length code generated by the encoder 250-1 with that generated by the encoder 250-2. The selector 270 then selects a variable-length code having a smaller code amount (fewer bits), and outputs the code as a variable-length code 220 corresponding to the fixed-length code 210. The selector 270 can add, to the variable-length code 220, information indicating whether the variable-length code 220 is generated by the encoder 250-1 or 250-2.

An example of the processing of the selector 270 will be explained below with reference to FIGS. 7A to 7C. In each of FIGS. 7A to 7C, the first bit (mode) is mode information indicating that the variable-length code is a bi-level-mode, variable-length code. FIG. 7A shows a variable-length code generated by the encoder 250-1. FIG. 7B shows a variable-length code generated by the encoder 250-2.

The selector 270 selects the variable-length code shown in FIG. 7B, which is generated by the encoder 250-2 and has fewer bits. In this case, the selector 270 generates a variable-length code shown in FIG. 7C by adding "1" immediately after the mode information of the variable-length code shown in FIG. 7B, and outputs the generated code as the variable-length code 220. If the selector 270 selects the variable-length code generated by the encoder 250-1, "0" is added immediately after the mode information of the variable-length code. In the above arrangement, it is possible to perform encoding in both cases in which C0 and C1 are inverted and not inverted, and adopt a variable-length code having a higher compression efficiency.

In this embodiment as has been explained above, block images encoded by different fixed length encoding modes undergo variable length encoding processes respectively suited to these block images. This implements efficient compression for image data containing block images encoded by different fixed length encoding modes. In this embodiment, it is unnecessary to decode all fixed-length codes obtained by dividing an original image and performing fixed length encoding on the divided images, and perform variable length encoding on the decoded codes again. As one variable length encoding method, it is possible to use a method that decodes a fixed-length code into a block image (decoded divided image), and performs variable length encoding by using, for example, predictive encoding by referring to another block image (reference divided image). However, it is expected that block images to which the same fixed length encoding method is applied have similar properties. By using the method of this embodiment, therefore, a block image can predictively be encoded by referring to another block image to which the same fixed length encoding method is applied, without performing any extra process of searching for still another appropriate block image.

In this embodiment, one of the plurality of encoders processes a fixed-length code corresponding to one block image. However, two or more variable-length codes may be generated by allowing each of two or more encoders to process one fixed-length code. In this case, a variable-length code having the smallest code amount can be adopted as a variable-length code corresponding to the processed fixed-length code. It is possible to externally set the correspondence between the fixed length encoding mode of a fixed-length code and an encoder for encoding the fixed-length code.

A fixed-length code to be processed is not limited to a fixed-length code encoded by the fixed length encoding method explained in the above embodiment. For example, when performing fixed length encoding by the bi-level mode, C0 and C1 can be calculated as the average pixel value of a group of pixels. Also, it is possible to use different reduction rates when performing fixed length encoding by the continuous tone mode, and adaptively change the reduction rate in accordance with a block image.

Additionally, the fixed length encoding method is not limited to the bi-level mode or continuous tone mode, and can also be another method. In this case, an encoder corresponding to each fixed length encoding method can be used. Furthermore, although the bi-level-mode, fixed-length code contains C0, C1, and the position information in this embodiment, at least one of these pieces of information may further be encoded. For example, a fixed-length code may contain entropy-encoded position information. In this case, the encoders 250-1 and 250-2 can decode encoded position information, and then compare the decoded position information with the position information of an adjacent block image.

The variable length encoding method is not limited to the method described above. For example, it is also possible to obtain the number of identical block images (or fixed-length codes) that continue, and perform variable length encoding by using this number. In the bi-level mode, C0 and C1 can orthogonally be transformed together with C0 and C1 of nearby blocks, and can further be entropy-encoded. For example, pixels each having C0 corresponding to a block image as a pixel value are arrayed in accordance with the positions of block images, thereby generating an image having pixels equal in number to block images in a processing target image. This image can be orthogonally transformed and entropy-encoded. In the continuous tone mode, the number of continuous 0s (0 runlength) can further be entropy-encoded.

[Modification of First Embodiment]

In the first embodiment, when performing variable length encoding on position information, the encoders 250-1 and 250-2 use the correlation with the position information of an adjacent block image. In this modification, one block image is divided into a plurality of sub blocks (regions), and variable length encoding is performed on the position information of each sub block based on the correlation with the position information of an adjacent sub block. In the following description, if the pieces of position information of adjacent sub blocks match, the position information of one sub block is replaced with information indicating that the position information matches that of the other sub block.

The processing of this modification will be explained below with reference to FIG. 6. Assume that a fixed-length code indicating the block image 330 is the target of variable length encoding. First, the block image 330 is divided into four sub blocks 331, 332, 333, and 334. Although the block image is divided into four sub blocks in this modification for the sake of explanation, the block image can be divided into any number of sub blocks. Then, the position information of each sub block is compared with that of another.

For example, when encoding the sub block 331, the sub block 331 is compared with the upper adjacent sub block 322 and left adjacent sub block 313. Similarly, when encoding the sub block 332, the sub block 332 is compared with the upper adjacent sub block 331 and left adjacent sub block 314. This applies to the sub blocks 333 and 334 as well. As in the first embodiment, "00" is set as the position information if it matches the position information of the upper adjacent sub block, and "01" is set as the position information if it matches the position information of the left adjacent sub block.

If there is no adjacent sub block or encoding is not performed by the bi-level mode, it is determined that the two pieces of position information do not match. If a sub block to be encoded does not match either an upper adjacent sub block or left adjacent sub block, data obtained by adding "1" to the head of the position information of the sub block to be encoded is set as variable-length-encoded position information.

In the example shown in FIG. 3, the position information of the lower left sub block of the block image 420 matches that of the lower right sub block of the block image 410 when one of these pieces of position information is inverted. Accordingly, it is possible to efficiently compress, for example, a processing target image containing the block images 410 and 420.

[Second Embodiment]

The information processing apparatus 100 according to the first embodiment includes a plurality of encoding units (for example, the first and second encoding units 150 and 160). This increases the circuit scale if dedicated hardware is used as each encoding unit. In this embodiment, therefore, one encoding unit performs variable length encoding on a fixed-length code generated by each mode. A fixed-length code input to an information processing apparatus according to this embodiment is the same as that of the first embodiment.

Figure 9:
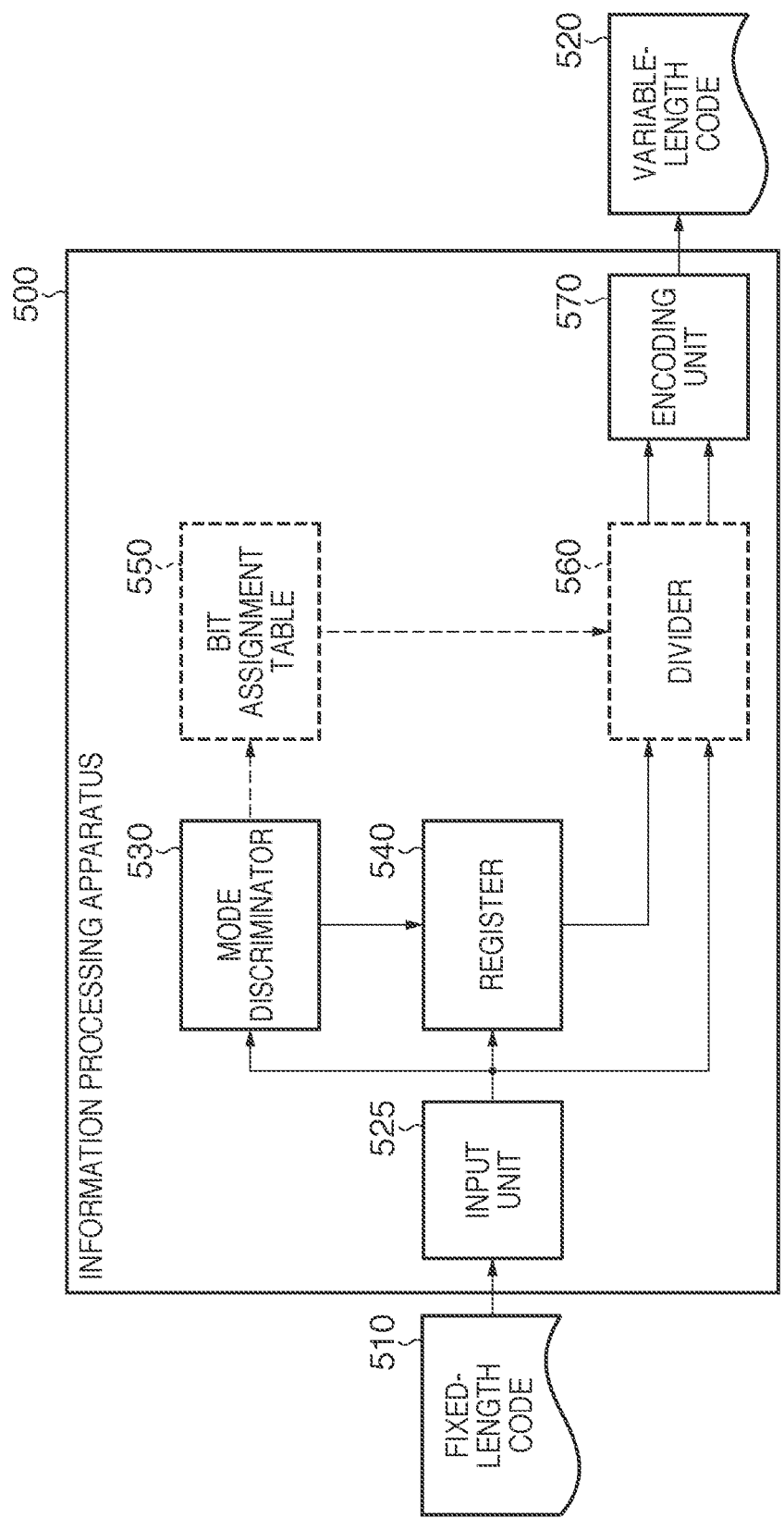
FIG. 9 is a block diagram showing an example of the arrangement of an information processing apparatus according to the second embodiment.
Figure 11:
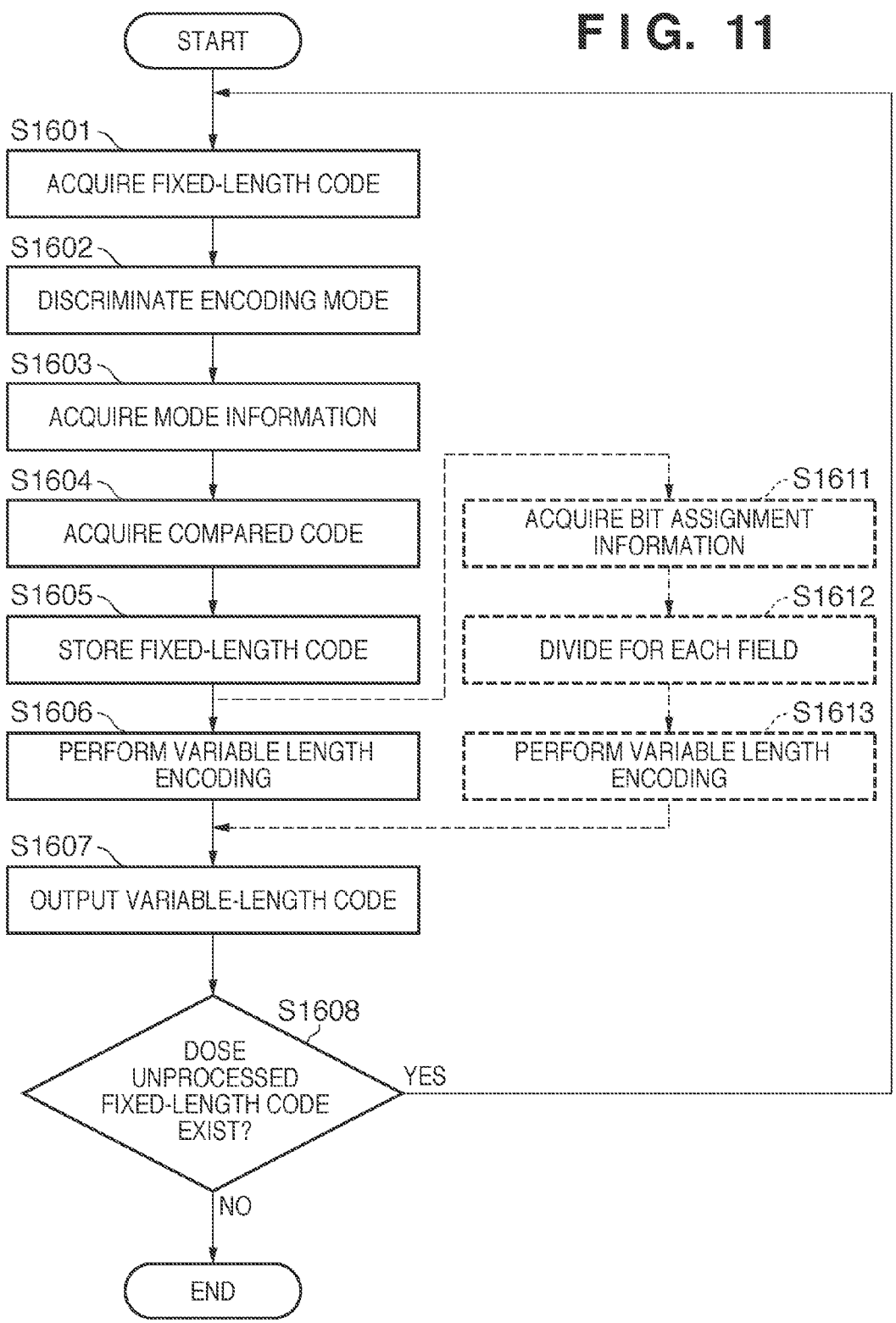
FIG. 11 is a flowchart showing an example of the processing of the information processing apparatus according to the second embodiment.

FIG. 9 shows an example of the information processing apparatus according to this embodiment. FIG. 11 shows an example of a flowchart of processing according to this embodiment. In step S1601, an input unit 525 (an input unit) acquires a fixed-length code 510. In step S1602, a mode discriminator 530 (a determination unit) discriminates the encoding mode of the fixed-length code 510, like the mode discriminator 130 of the first embodiment. In step S1603, an encoding unit 570 acquires the fixed-length code 510, and acquires information indicating the encoding mode of the fixed-length code 510 from the mode discriminator 530.

In step S1604, the encoding unit 570 acquires a fixed-length code generated by the same encoding mode as that of the fixed-length code 510 and stored in a register 540. The fixed-length code acquired in step S1604 will be called a compared code hereinafter. The register 540 stores input fixed-length codes as will be described later. In this embodiment, the encoding unit 570 acquires a fixed-length code stored latest (most recently), among fixed-length codes generated by the same encoding mode as that of the fixed-length code 510 and stored in the register 540. However, the register 540 may store more fixed-length codes. In this case, the fixed-length code of a block image positioned near a block image indicated by the fixed-length code 510 in an original image can also be acquired as a compared code to be described below.

In step S1605, the register 540 stores the fixed-length code 510. In this step, a fixed-length code generated by the same encoding mode as that of the fixed-length code 510 and stored in the register 540 beforehand can be overwritten. In this case, the register 540 can store both a bi-level-mode, fixed-length code input latest, and a continuous-tone-mode, fixed-length code input latest. However, the register 540 can also store more fixed-length codes.

In step S1606, the encoding unit 570 performs variable length encoding on the fixed-length code 510 by referring to the compared code. In step S1606, the encoding unit 570 can also perform variable length encoding on a portion of the fixed-length code 510 except for mode information. The mode information is directly added to, for example, the head of the variable-length code generated by the encoding unit 570. The encoding unit 570 may use predictive encoding such as DPCM (Differential Pulse Code Modulation). The encoding unit 570 calculates, for example, the difference between the fixed-length code 510 and compared code. In this case, encoding such as entropy encoding can also be performed on the calculated difference. Since the block image indicated by the fixed-length code 510 and the block image indicated by the compared code exist in one processing target image, coefficients in fields expectedly have similar values.

The field herein mentioned indicates each data contained in a fixed-length code. For example, the bi-level-mode, fixed-length code shown in FIG. 2A contains mode information, C0, C1, and position information as fields. Also, since the fixed-length code 510 and compared code are generated by the same encoding mode, bits in the same position indicate information of the same field. If the difference between the fixed-length code 510 and compared code is binary data, therefore, a portion where many "0"s or "1"s continue expectedly exists. Accordingly, it is expected that the difference between the fixed-length code 510 and compared code has a small entropy, and hence can largely be compressed when performing encoding such as entropy encoding.

In step S1607, the encoding unit 570 (an output unit) outputs the variable-length code generated in step S1606 as a variable-length code 520. In step S1608, the input unit 525 determines whether there is an unprocessed fixed-length code. If there is an unprocessed fixed-length code, the process returns to step S1601. If there is no unprocessed fixed-length code, the process of this embodiment is terminated.

In this embodiment as described above, variable length encoding is performed on a fixed-length code by using the correlation with a fixed-length code generated by the same fixed length encoding method. In this embodiment, a high compression rate can expectedly be obtained compared to a method of performing variable length encoding without taking the encoding mode into account. Although this embodiment uses DPCM as variable length encoding, a different method may be used. Also, in this embodiment, a fixed-length code, which is generated by the same encoding mode as that of a fixed-length code as a processing target and input immediately before the fixed-length code as a processing target, is used as the compared code. However, it is also possible to use, as the compared code, the fixed-length code of a block image adjacent to a block image indicated by a fixed-length code to be processed.

As in the first embodiment, the encoding mode is not limited to the bi-level mode and continuous tone mode, and it is possible to use another mode, or use three or more encoding modes for one processing target image. In this case, the register 540 can store at least one fixed-length code of each encoding mode.

[First Modification of Second Embodiment]

This modification performs variable length encoding on a coefficient in each field of a fixed-length code by referring to a coefficient in the same field of the compared code. The processing of this modification is similar to that of the second embodiment, so different portions will be explained below. In step S1603, a divider 560 acquires the fixed-length code 510 and information indicating the encoding mode of the fixed-length code 510. In step S1604, the divider 560 acquires the compared code. Instead of step S1606, this modification executes steps S1611 to S1613. In step S1611, the divider 560 acquires, from an assignment table 550, bit assignment information indicating the number of bits of each field of the fixed-length code 510. For example, bit assignment information corresponding to the information acquired in step S1603 and indicating the encoding mode of the fixed-length code 510 is acquired from the assignment table 550. In this modification, a bi-level-mode, fixed-length code has, for example, the structure as shown in FIG. 2A. In this modification, bit assignment information for the bi-level mode indicates that the first information (mode information) has 1 bit, the next information (C0) has 8 bits, the next information (C1) has 8 bits, and the next information (position information) has 63 bits.

In step S1612, the divider 560 divides the fixed-length code 510 and compared code for each field, and sends the result to the encoding unit 570. For example, the divider 560 sends the bi-level-mode, fixed-length code 510 to the encoding unit 570 in the order of the mode information, C0, C1, and position information. Since the position information is large, the divider 560 may send the position information line by line (every 8 bits).

Figure 10:
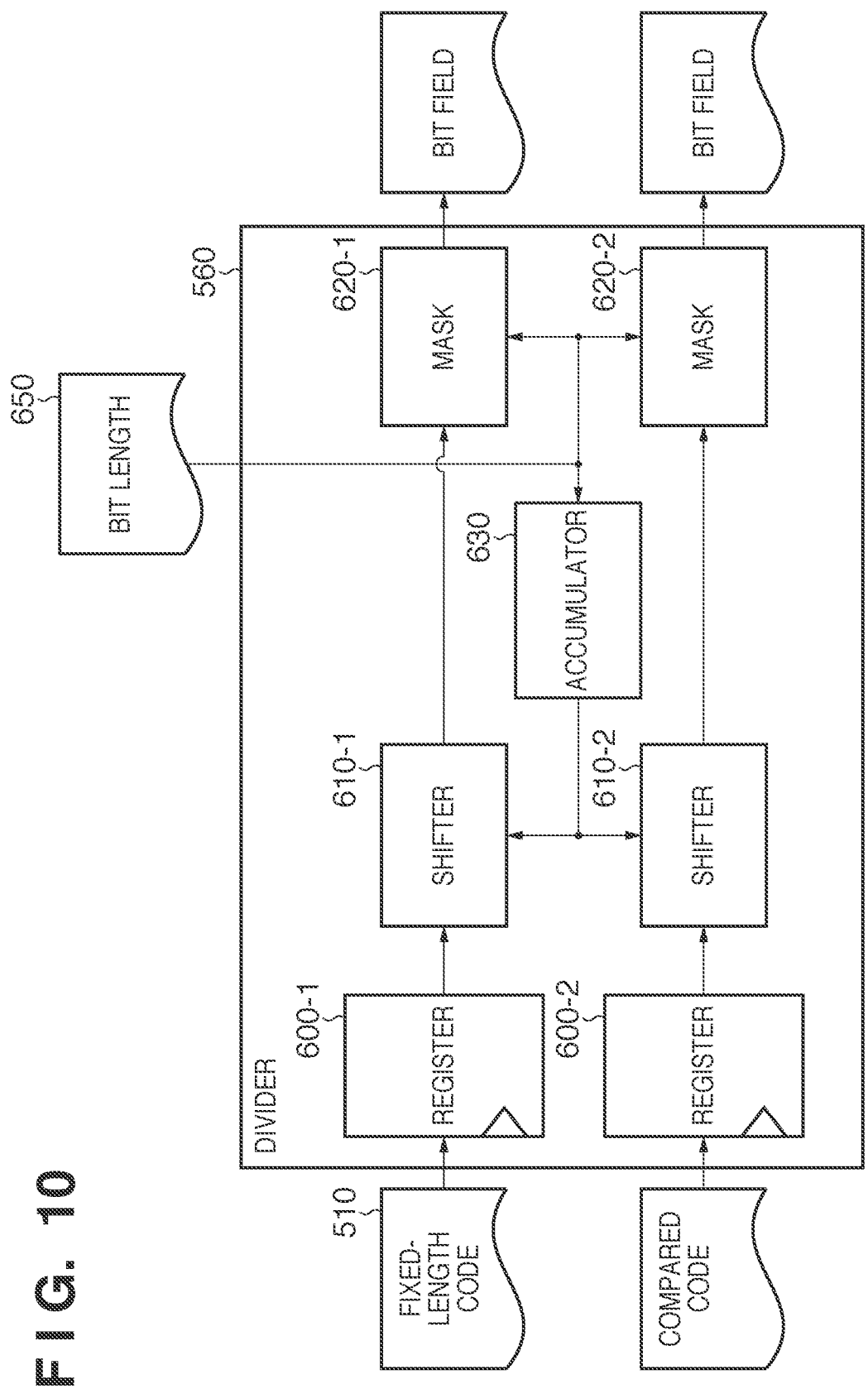
FIG. 10 is a block diagram showing an example of the arrangement of a divider 560 according to the second embodiment.

FIG. 10 shows an example of the arrangement of the divider 560. A register 600-1 stores the fixed-length code 510. A register 600-2 stores the compared code. The bit lengths 650 of individual fields are sequentially transmitted from the assignment table 550 to an accumulator 630, mask 620-1, and mask 620-2. The accumulator 630 acquires the bit length 650 of a field to be cut out next from the assignment table 550, and accumulates the acquired bit length. Note that if the accumulated value exceeds the number of bits (in this modification, 81) of fixed-length-encoded data, the accumulator 630 resets the accumulated value to 0. Then, the accumulator 630 sends the accumulated value to shifters 610-1 and 610-2.

When receiving the accumulated value from the accumulator 630, the shifter 610-1 acquires the fixed-length code 510 from the register 600-1, and shifts each bit of the fixed-length code 510 to the right so as to position the field to be cut out on the LSB side. The shifter 610-1 then sends the shifted fixed-length code 510 to the mask 620-1. The shifter 610-2 similarly shifts the compared code, and sends the shifted compared code to the mask 620-2.

The mask 620-1 refers to the field bit length 650 acquired from the assignment table 550, and cuts out the field from the fixed-length code 510 which have been shifted right. For example, an upper bit exceeding the bit length of the field is replaced with "0". Likewise, the mask 620-2 cuts out the field from the compared code which has been shifted right. In this manner, the cutout field is supplied to the encoding unit 570.

In step S1613, the encoding unit 570 performs variable length encoding on the coefficient in each field supplied from the divider 560, by using the correlation with the coefficient in the corresponding field of the compared code. For example, variable length encoding is performed on C0 of the fixed-length code 510 by referring to C0 of the compared code. This process can be executed in the same manner as in the second embodiment. For example, DPCM can be used. After that, steps S1608 and S1609 are executed in the same way as in the second embodiment.

The encoding unit 570 may integrate the variable-length-encoded fields into a code indicating one block image. In this modification, each variable-length-encoded field can have information indicating the correspondence to the field. Also, as described in the first embodiment, pixels each having a field coefficient corresponding to a block image are arrayed for each field in accordance with the positions of block images, thereby generating an image having pixels equal in number to block images in a processing target image. This image may orthogonally be transformed and entropy-encoded. In this case, two-dimensional discrete cosine transform can also be used.

[Second Modification of Second Embodiment]

In the first modification of the second embodiment, the encoding unit 570 performs variable length encoding on all fields (except for mode information). However, Huffman encoding is performed on, for example, a continuous-tone-mode AC component. If variable length encoding is performed on this AC component by using DPCM, therefore, the AC component cannot efficiently be compressed, or the code amount may increase. Accordingly, this modification performs variable length encoding on only designated fields.

An example of an information processing apparatus according to this modification will be explained below with reference to FIGS. 9 and 11. The information processing apparatus according to this modification and the processing of the apparatus are similar to those of the first modification of the second embodiment, so differences will be explained. The assignment table 550 holds a flag indicating whether to set each field as the target of DPCM, in addition to the bit length of the field. In step S1612, the encoding unit 570 determines whether to perform DPCM on data supplied from the divider 560, by referring to the flag in the assignment table 550. If DPCM is to be performed, the encoding unit 570 performs the same processing as that of the first modification of the second embodiment. If no DPCM is to be performed, the encoding unit 570 directly outputs divided fields from the fixed-length code 510.

As explained above, this modification can achieve efficient encoding by selecting whether to encode each field. Note that although whether to perform encoding is selected in this modification, a variable length encoding method to be used may be selected. For example, it is also possible to select, for each field, variable length encoding using DPCM or variable length encoding using discrete cosine transform.

[Third Embodiment]

Figure 12:
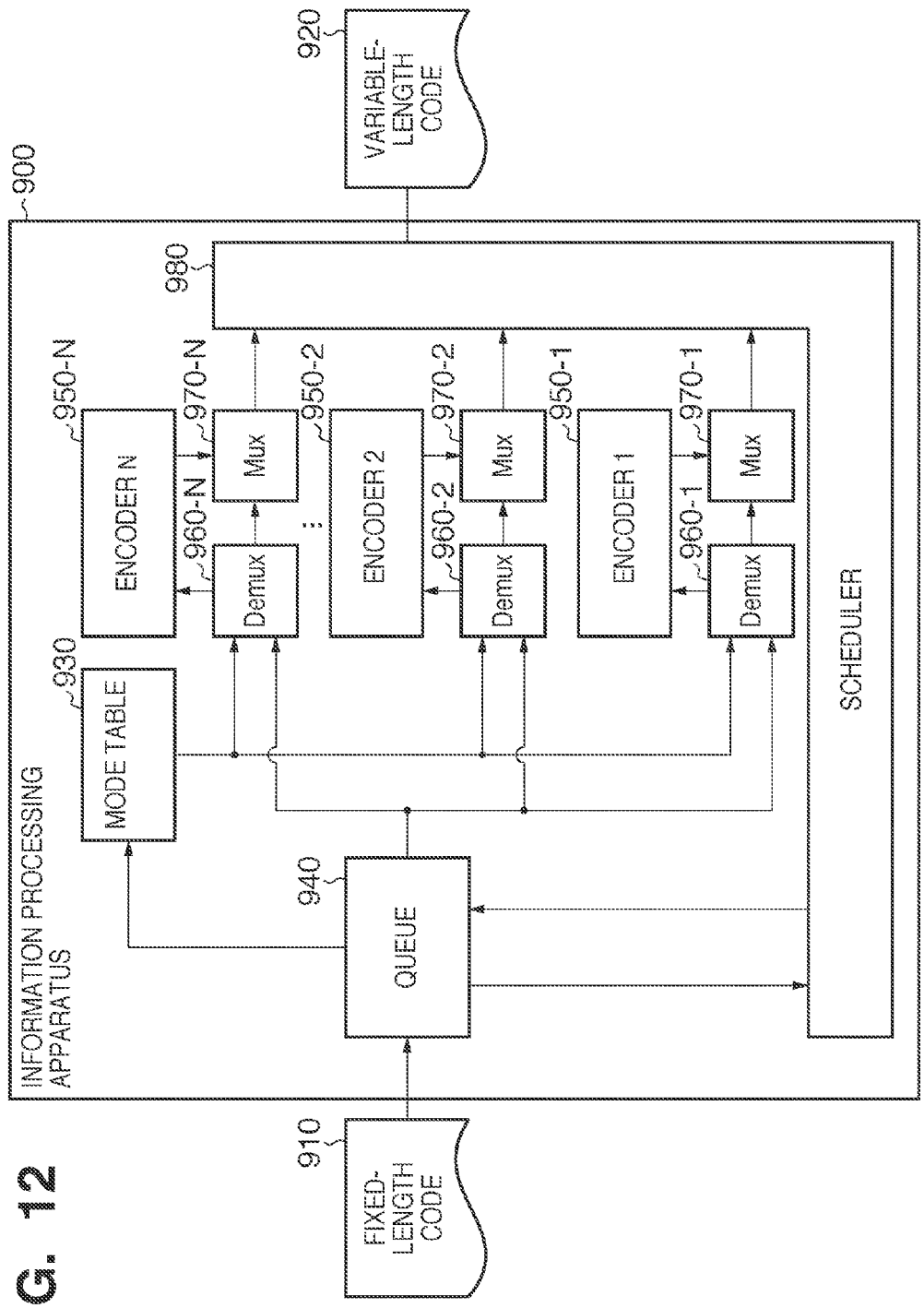
FIG. 12 is a block diagram showing an example of the arrangement of the information processing apparatus according to the third embodiment.

In the first embodiment, the information processing apparatus 100 that includes the two encoding units 150 and 160 and performs variable length encoding on fixed-length codes generated by different fixed length encoding modes has been explained. In this embodiment, an information processing apparatus that includes a plurality of encoders and performs variable length encoding in accordance with a plurality of fixed length encoding modes will be explained. FIG. 12 shows an information processing apparatus 900 according to this embodiment. For the sake of explanation, it is assumed that the information processing apparatus 900 of this embodiment includes N (N is an integer of 2 or more) encoders 950. Assume also that the information processing apparatus 900 of this embodiment corresponds to M (M is an integer of 2 or more) kinds of fixed length encoding modes.

In this embodiment, one or more encoders corresponding to one fixed length encoding mode are designated beforehand. One fixed-length code undergoes variable length encoding performed by at least one of the corresponding encoders. Encoders not corresponding to a fixed-length code to be processed output the fixed-length codes without performing any variable length encoding. When a plurality of encoders process one fixed-length code, an optimum processing result is selected by taking account of, for example, a target compression rate.

As shown in FIG. 12, the information processing apparatus 900 according to this embodiment includes the N encoders 950 (a conversion unit). A demultiplexer 960 is placed before each encoder 950. The demultiplexer 960 can send a fixed-length code to the encoder 950 or directly output the fixed-length code without sending it to the encoder 950, in accordance with the fixed length encoding mode. A scheduler 980 performs control to output data encoded by an encoder corresponding to the data, in accordance with the fixed length encoding mode. For the sake of explanation, it is assumed that M=4 and N=3. That is, the information processing apparatus of this embodiment includes encoder 1 950-1, encoder 2 950-2, and encoder 3 950-3. Assume also that a fixed-length code has 81 bits for one block. Furthermore, the fixed length encoding mode can be discriminated by referring to three upper bits of a fixed-length code.

The operation of each unit of the information processing apparatus 900 will be explained in detail below. Each encoder 950 is a multi-cycle type calculator that performs variable length encoding on fixed-length-encoded data. These encoders execute different variable length encoding methods, and have different latencies. In accordance with external instructions, each encoder can stop processing for given data, and start processing the next data. Note that processing performed by each encoder 950 is not particularly limited. The encoders 950 may include, for example, the first encoding unit 150 for the continuous tone mode or the second encoding unit 160 disclosed in the first embodiment. The encoders 950 can also include, for example, the information processing apparatus 500 disclosed in the second embodiment, or an encoder that performs lossy compression.

A queue 940 (an input unit) stores an input fixed-length code. The queue 940 includes an internal register, and can hold, for example, a fixed-length code equivalent to four block images. Following instructions from the scheduler 980, the queue 940 inputs the fixed-length code to the demultiplexers 960, and supplies the mode information of the fixed-length code to a mode table 930. The supplied fixed-length code can be erased under the control of the scheduler 980.

The mode table 930 individually holds the information of the encoder 950 that handles each fixed length encoding mode. For example, the mode table 930 shows one or more encoders 950 associated with one fixed length encoding mode. The correspondence information of the mode table 930 can externally be preset.

FIG. 13 shows an example of the correspondence information held by the mode table 930. The mode table 930 holds three upper bits of fixed-length codes in association with corresponding encoders. In this embodiment, it is assumed that three upper bits of a fixed-length code indicate the encoding mode of the fixed-length code. As shown in FIG. 13, when one upper bit of a fixed-length code is "0", the fixed-length code is generated by the bi-level mode. When two upper bits of a fixed-length code are "10", the fixed-length code is generated by the continuous tone mode. When three upper bits of a fixed-length code are "110", the fixed-length code is generated by mode A. When three upper bits of a fixed-length code are "111", the fixed-length code is generated by mode B.

"SELECTED ENCODER" shown in FIG. 13 is 3-bit information indicating an encoder corresponding to each encoding mode. The most significant bit, second uppermost bit, and third uppermost bit respectively indicate whether encoders 1, 2, and 3 can handle the encoding mode of a fixed-length code. When the bit is "1", the encoder can handle the encoding mode of a fixed-length code. That is, encoders 2 and 3 can handle the bi-level mode (when the three upper bits of a fixed-length code are "000", "001", "010", or "011"). Encoder 1 can handle the continuous tone mode (when the three upper bits of a fixed-length code are "100" or "101"). Encoders 1 and 2 can handle mode A (when the three upper bits of a fixed-length code are "110"). Encoders 1 to 3 can handle mode B (when the three upper bits of a fixed-length code are "111").

In accordance with the above-described information indicated by "SELECTED ENCODER" shown in FIG. 13, the mode table 930 sends the correspondence information of the encoders 950 to the corresponding demultiplexers 960 (a determination unit). The explanation will be made by assuming that the encoding mode of a fixed-length code is the bi-level mode. In this case, the mode table 930 sends "0" to the demultiplexer 960-1 before encoder 1 950-1, "1" to the demultiplexer 960-2 before encoder 2 950-2, and "1" to the demultiplexer 960-3 before encoder 3 950-3.

After the fixed-length code is input from the queue 940, the demultiplexer 960 supplies the fixed-length code input from the queue 940 to the encoder 950 or a multiplexer 970, in accordance with the correspondence information sent from the mode table 930. The encoder 950 performs variable length encoding on the fixed-length code supplied from the demultiplexer 960, and supplies the code to the multiplexer 970. Data is supplied to the multiplexer 970 (a converter) from one of the encoder 950 and demultiplexer 960.

The multiplexer 970 outputs, to the scheduler 980, the data (output code) supplied from the encoder 950 or demultiplexer 960. In the arrangement of this embodiment, an encoder which, in the mode table 930, has a correspondence with a fixed-length code input to the demultiplexer 960 existing before the encoder performs variable length encoding on the input fixed-length code. On the other hand, an encoder which, in the mode table 930, does not have a correspondence with a fixed-length code input to the demultiplexer 960 existing before the encoder does not perform variable length encoding on the input fixed-length code.

Next, the scheduler 980 will be explained below. The scheduler 980 performs control so that the encoder 950 corresponding to the encoding mode of each fixed-length code encodes the input fixed-length code. The scheduler 980 can simultaneously manage a plurality of fixed-length codes. The scheduler 980 outputs variable-length codes 920 corresponding to fixed-length codes 910 in the order in which the fixed-length codes 910 are input to the queue 940.

The scheduler 980 holds information indicating the states of variable length encoding as shown in, for example, FIGS. 14A to 14D. A data set indicating the processing state of one fixed-length code will be called a slot hereinafter. The information processing apparatus of this embodiment can simultaneously manage the processing of four fixed-length codes, and includes four slots. Tables shown in FIGS. 14A to 14D will be called slot boards hereinafter. The scheduler 980 updates the slot boards as the variable length encoding process progresses.

Referring to FIGS. 14A to 14D, "SLOT NUMBER" is an index for sequence management assigned to each fixed-length code. A fixed-length code input later is assigned a larger slot number. Also, a variable-length code corresponding to a fixed-length code assigned a smaller slot number is output earlier. In this embodiment, the output variable-length code corresponds to the fixed-length code of slot number 1. When the variable-length code corresponding to slot number 1 is output, the slot number returns to 4, and the slot numbers of other slots reduce by 1.

Referring to FIGS. 14A to 14D, "ID1" to "ID4" (not shown) are assigned to each slot. "STATE" indicates whether each slot is assigned a fixed-length code. When a fixed-length code is input, the fixed-length code is assigned a slot having the smallest slot number among slots for which "STATE" is "EMPTY". "STATE" of the slot assigned the fixed-length code changes to "EFFECTIVE". When the variable-length code is output, "STATE" of the corresponding slot returns to "EMPTY".

Referring to FIGS. 14A to 14D, "ENCODER 1", "ENCODER 2", and "ENCODER 3" respectively indicate the processing states of fixed-length codes corresponding to the slots. "ENCODER 1", "ENCODER 2", and "ENCODER 3" are initially "UNPROCESSED", and change in the order of "UNPROCESSED"→"BEING PROCESSED"→"PROCESSED"→"UNPROCESSED". When the queue 940 supplies a fixed-length code to the demultiplexer 960-1 positioned before the encoder 950-1, "ENCODER 1" changes to "BEING PROCESSED". Also, when the multiplexer 970-1 outputs data to the scheduler 980, "ENCODER 1" changes to "PROCESSED". The same applies to "ENCODER 2" and "ENCODER 3" as well. When the information processing apparatus 900 outputs the variable-length code 920 corresponding to the fixed-length code 910, "ENCODER 1", "ENCODER 2", and "ENCODER 3" return to "UNPROCESSED".

If "ENCODER 1" is not "BEING PROCESSED" for any of slots ID1 to ID4, the scheduler 980 specifies a slot having the smallest slot number among slots for which "ENCODER 1" is "UNPROCESSED". When the scheduler 980 sends an instruction to the queue 940, a fixed-length code corresponding to the specified slot is supplied from the queue 940 to the demultiplexer 960-1 positioned before encoder 1 (950-1). The scheduler 980 changes "ENCODER 1" of the specified slot to "BEING PROCESSED". The same applies to "ENCODER 2" and "ENCODER 3" as well. If a fixed-length code is supplied to an encoder which, in the mode table 930, does not have a correspondence with the fixed-length code, no variable length encoding is performed on the fixed-length code. Since, therefore, the fixed-length code is directly supplied to the scheduler 980, "BEING PROCESSED" immediately changes to "PROCESSED".

"MINIMUM NUMBER OF BITS" indicates the number of bits of data having the smallest code amount among data supplied to the scheduler 980 by the multiplexers 970-1 to 970-3. If the encoding result received by the scheduler 980 is smaller than the number of bits stored as "MINIMUM NUMBER OF BITS" or if "MINIMUM NUMBER OF BITS" is not stored, the encoding result is separately held. In addition, the number of bits of the encoding result received by the scheduler 980 is stored in "MINIMUM NUMBER OF BITS". "MINIMUM BIT ENCODER" indicates an encoder having generated data having the smallest code amount among data received by the scheduler 980.

If "MINIMUM NUMBER OF BITS" of slot number 1 becomes smaller than a target number of bits, the scheduler 980 (a selection unit) outputs an encoding result having the smallest code amount, among encoding results for the fixed-length code of slot number 1. If "ENCODER 1" to "ENCODER 3" become "PROCESSED", the scheduler 980 similarly outputs an encoding result having the smallest code amount, among encoding results for the fixed-length code of slot number 1. The encoding result having the smallest code amount is held as described above. The target number of bits described above may externally be set. Since the encoding result is output even when the number of bits is smaller than the target number of bits, it is unnecessary to wait until all the encoders complete the processing. Accordingly, even when not all the encoders have completed the processing for one fixed-length code, the processing of another fixed-length code can be started. Information indicating "MINIMUM BIT ENCODER" can be added to the encoding result to be output from the scheduler 980.

An example of the update of the slot board will be explained below with reference to FIGS. 14A to 14D. Note that hatched items indicate updated items. Assume that the slot board is in the state shown in FIG. 14A at a given time. The fixed-length codes of slots 1 and 2 are encoded by the bi-level mode. The fixed-length code of slot 3 is encoded by mode A. If a fixed-length code of mode A is input in this state, the input fixed-length code is assigned the slot having ID4 because the state of this slot is "EMPTY". Then, the slot board is updated as shown in FIG. 14B. It is also possible to store an input fixed-length code in a queue (not shown) in order to prepare for a case in which the states of all the slots are "EFFECTIVE".

Then, the slot board is updated as shown in FIG. 14C when encoder 2 completes the processing for the fixed-length code of slot ID1 and encoder 3 completes the processing for the fixed-length code of slot ID2. That is, "ENCODER 2" of slot ID1 and "ENCODER 3" of slot ID2 are changed to "PROCESSED". Also, "MINIMUM NUMBER OF BITS" of each of slots ID1 and ID2 is updated as needed. The scheduler 980 instructs the queue 940 to cause the encoder 2 having processed the fixed-length code to start processing the fixed-length code of slot ID2. Also, the scheduler 980 instructs the queue 940 to cause encoder 3 having processed the fixed-length code to start processing the fixed-length code of slot ID3.

For slot ID1, the slot number is 1, and "ENCODER 1" to "ENCODER 3" are "PROCESSED". Accordingly, the scheduler 980 outputs an encoding result corresponding to slot ID1 as a variable-length code. Also, the scheduler 980 instructs the queue 940 to erase the fixed-length code corresponding to slot ID1. Since the data of slot ID1 is output, "STATE" of slot ID1 becomes "EMPTY". The slot number of slot ID1 is changed to "4". The slot numbers of slots ID2 to ID4 are reduced by 1. As a consequence, the slot board is updated as shown in FIG. 14D. Although "ENCODER 3" of slot 3 is "BEING PROCESSED" in FIG. 14C, this processing is immediately terminated because encoder 3 does not handle the fixed-length code of slot 3. Therefore, "ENCODER" of slot 3 is "PROCESSED" in FIG. 14D.

By the above operation, the scheduler 980 can dynamically assign encoders to fixed-length codes while matching the input sequence of the fixed-length codes with the output sequence of variable-length codes corresponding to the fixed-length codes. The scheduler 980 can also allow an encoder corresponding to the encoding mode of each fixed-length code to process the code.

In this embodiment, the target number of bits of a variable-length code is externally set. However, the target number of bits may dynamically be changed. For example, if a variable-length code to be output is smaller by n bits than the target number of bits, the target number of bits of a variable-length code to be output next can be increased by n bits. On the contrary, if a variable-length code to be output is larger by n bits than the target number of bits, the target number of bits of a variable-length code to be output next can be decreased by n bits.

Also, the slot management method is not limited to the above-mentioned method. For example, fixed-length codes input later need not be assigned larger slot numbers unlike in this embodiment. In this case, the order of fixed-length codes can be rearranged after output. Furthermore, if a variable-length code corresponding to a fixed-length code input later is output earlier than a variable-length code corresponding to a fixed-length code input earlier, a flag indicating that the sequence is changed may be added to at least one of the variable-length codes. In this case, the variable-length codes can be rearranged when, for example, they are decoded. Although this embodiment uses four slots, any arbitrary number of slots can be used.

[Fourth Embodiment]

In this embodiment, a computer performs the processing according to each embodiment described above. FIG. 15 shows the basic configuration of the computer. In order to execute the functions of the above-described embodiments in this computer, each function can be expressed by a program and the program can be loaded into the computer. This enables the computer to execute all the functions of the above-described embodiments. In this case, each of the constituent elements shown in FIG. 15 and the like can be embodied by a functional formula or a subroutine executed by a CPU. A computer program is normally stored in a computer-readable storage medium such as a CD-ROM. The computer program can be executed by setting the storage medium in a reader (for example, a CD-ROM drive) of the computer, and copying the program to or installing it in the system. Accordingly, the scope of the present invention obviously incorporates this computer-readable storage medium.

Referring to FIG. 15, a CPU 2001 controls the overall operation of the computer. In this embodiment, a program is stored in a secondary memory 2003 such as a hard disk or CD-ROM. The CPU 2001 loads the program into a primary memory 2002 such as a RAM, and executes the loaded program. An input device 2004 is a device for inputting information to the computer. Examples are a mouse and keyboard. An output device 2005 is a device to which the computer outputs information, and includes a monitor and printer. A reading device 2006 is a device for acquiring external data, and includes a memory card reader and network card. A bus 2008 connects the individual units described above, and allows them to exchange data.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-024824, filed Feb. 5, 2010 which is hereby incorporated by reference herein in its entirety.

What is claimed is:

1. An information processing apparatus for converting fixed-length codes into variable-length codes, each of the fixed-length codes being generated by performing fixed length encoding, by using one of a plurality of fixed length encoding methods, on each divided image obtained by dividing an original image, comprising:
   an input unit configured to obtain each of the fixed-length codes as an input code;
   a determination unit configured to determine a fixed length encoding method of the input code;
   a conversion unit configured to perform variable length encoding, by using a first variable length encoding method, on the input code encoded by a first fixed length encoding method, and perform variable length encoding, by using a second variable length encoding method, on the input code encoded by a second fixed length encoding method; and
   an output unit configured to output a variable-length code obtained by said conversion unit,
   wherein the fixed-length code encoded by the first fixed length encoding method includes a plurality of fields; and
   the conversion unit is further configured to perform the variable length encoding as the first variable length encoding method by comparing a coefficient in the field included in the input code with a coefficient in a corresponding field included in a compared code, wherein the compared code is generated by performing fixed length encoding on the divided image by the first fixed length encoding method.

2. The apparatus according to claim 1, wherein the conversion unit is further configured to perform the variable length encoding as the second variable length encoding method by replacing continuation of predetermined values in the input code with a value indicating a length of the continuous values.

3. The apparatus according to claim 2, wherein
   the input code obtained by encoding the divided image by the first fixed length encoding method contains a first pixel value, a second pixel value, and a value indicating which of the first pixel value and the second pixel value each pixel of the divided image has, and
   the input code obtained by encoding the divided image by the second fixed length encoding method contains a DC component value of the divided image, and an AC component value of the divided image.

4. The apparatus according to claim 1, wherein
   said conversion unit comprises a plurality of encoders,
   each of the plurality of encoders is associated with predetermined fixed length encoding methods, and
   when the input code is encoded by the associated fixed length encoding method, said encoder converts the input code into a variable-length code by using a variable length encoding method, which is preset in said encoder as a method of performing variable length encoding on the input code encoded by the fixed length encoding method.

5. An information processing apparatus for converting fixed-length codes into variable-length codes, each of the fixed-length codes being generated by performing fixed length encoding, by using one of a plurality of fixed length encoding methods, on each divided image obtained by dividing an original image, comprising:
   an input unit configured to obtain the fixed-length code as an input code;
   a determination unit configured to determine a fixed length encoding method of the input code;
   a conversion unit comprising a plurality of converters each configured to convert the input fixed-length code into a variable-length code based on the fixed length encoding method determined by said determination unit, and output the variable-length code as an output code, or directly output the input fixed-length code as an output code; and
   a selection unit configured to input the input code obtained by said input unit to each converter of said conversion unit, and thereafter selectively output an output code having a smallest code amount among the output codes output from said converters,
   wherein said converters are individually set to convert fixed-length codes encoded by different fixed length encoding methods into variable-length codes, and each converter converts the input fixed-length code into a variable-length code and outputs the variable-length code as an output code if a fixed length encoding method of the input fixed-length code is the set fixed length encoding method, and directly outputs the input fixed-length code as an output code if a fixed length encoding method of the input fixed-length code is not the set fixed length encoding method.

6. An information processing method for converting fixed-length codes into variable-length codes, each of the fixed-length codes being generated by performing fixed length encoding, by using one of a plurality of fixed length encoding methods, on each divided image obtained by dividing an original image, comprising the steps of:
   obtaining each of the fixed-length codes as an input code;
   determining a fixed length encoding method of the input code;
   performing variable length encoding, by using a first variable length encoding method, on the input code encoded by a first fixed length encoding method, and performing variable length encoding, by using a second variable length encoding method, on the input code encoded by a second fixed length encoding method; and
   outputting a variable-length code obtained in said performing step,
   wherein the fixed-length code encoded by the first fixed length encoding method includes a plurality of fields; and
   the step of performing includes performing the variable length encoding as the first variable length encoding method by comparing a coefficient in the field included in the input code with a coefficient in a corresponding field included in a compared code, wherein the compared code is generated by performing fixed length encoding on the divided image by the first fixed length encoding method.

7. An information processing method for converting fixed-length codes into variable-length codes, each of the fixed-length codes being generated by performing fixed length encoding, by using one of a plurality of fixed length encoding methods, on each divided image obtained by dividing an original image, comprising:
   a step of obtaining the fixed-length code as an input code;
   a step of determining a fixed length encoding method of the input code;

a plurality of converting steps of converting the input fixed-length code into a variable-length code based on the fixed length encoding method determined in said determining step and outputting the variable-length code as an output code, or directly outputting the input fixed-length code as an output code; and a step of selectively outputting an output code having a smallest code amount among the output codes, wherein each converting step is individually predetermined for converting fixed-length codes encoded by different fixed length encoding methods into variable-length codes, and in each converting step the input fixed-length code is converted into a variable-length code and output as an output code if a fixed length encoding method of the input fixed-length code is the predetermined fixed length encoding method, and the input fixed-length code is directly output as an output code if a fixed length encoding method of the input fixed-length code is not the predetermined fixed length encoding method.

8. A non-transitory computer-readable storage medium storing a computer program which causes a computer to function as an information processing apparatus cited in claim 1.

9. A non-transitory computer-readable storage medium storing a computer program which causes a computer to function as an information processing apparatus cited in claim 5.

\* \* \* \* \*